US009899593B2

(12) United States Patent
Shin et al.

(10) Patent No.: US 9,899,593 B2
(45) Date of Patent: Feb. 20, 2018

(54) BULK ACOUSTIC WAVE RESONATOR

(71) Applicant: SAMSUNG ELECTRONICS CO., LTD, Suwon-si (KR)

(72) Inventors: Jea Shik Shin, Hwaseong-si (KR); Duck Hwan Kim, Goyang-si (KR); Chul Soo Kim, Hwaseong-si (KR); Ho Soo Park, Wando-gun (KR); Sang Uk Son, Yongin-si (KR); In Sang Song, Osan-si (KR); Moon Chul Lee, Seongnam-si (KR); Cui Jing, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 84 days.

(21) Appl. No.: 13/686,005

(22) Filed: Nov. 27, 2012

(65) Prior Publication Data
US 2013/0181579 A1    Jul. 18, 2013

(30) Foreign Application Priority Data
Jan. 18, 2012   (KR) ................. 10-2012-0005760

(51) Int. Cl.
*H01L 41/107* (2006.01)
*H03H 9/17* (2006.01)
*H03H 9/02* (2006.01)

(52) U.S. Cl.
CPC ......... *H01L 41/107* (2013.01); *H03H 9/0211* (2013.01); *H03H 9/02102* (2013.01); *H03H 9/173* (2013.01); *H03H 9/175* (2013.01); *H03H 9/174* (2013.01)

(58) Field of Classification Search
CPC .......... H03H 9/1021; H03H 9/24; H03H 3/04; H03H 9/0211; H03H 9/175; H01L 41/0926; H01L 41/053
USPC ........................... 310/321, 346, 348
See application file for complete search history.

(56) References Cited

U.S. PATENT DOCUMENTS

| 6,991,953 B1* | 1/2006 | Bruner ................ B81C 1/00246 438/29 |
| 7,561,009 B2* | 7/2009 | Larson et al. ................ 333/187 |
| 8,648,671 B2* | 2/2014 | Son .......................... H03H 3/04 310/324 |
| 2004/0195937 A1 | 10/2004 | Matsubara et al. |
| 2005/0151600 A1* | 7/2005 | Takeuchi et al. ............. 333/191 |
| 2005/0189846 A1* | 9/2005 | Saito et al. ................... 310/311 |

(Continued)

FOREIGN PATENT DOCUMENTS

| JP | 10-270979 A | 10/1998 |
| JP | 2006-186832 | 7/2006 |

(Continued)

OTHER PUBLICATIONS

US Data for solids, Acoustic Impedance table Data, sound velocity values, Alan Selfridge.*

(Continued)

*Primary Examiner* — Bryan Gordon
(74) *Attorney, Agent, or Firm* — NSIP Law

(57) ABSTRACT

Provided is a bulk acoustic wave resonator (BAWR). The BAWR may include an air cavity disposed on a substrate, a bulk acoustic wave resonant unit including a piezoelectric layer, and a reflective layer to reflect a wave of a resonant frequency that is generated from the piezoelectric layer.

7 Claims, 5 Drawing Sheets

(56) References Cited

U.S. PATENT DOCUMENTS

| | | | |
|---|---|---|---|
| 2007/0035364 A1 | 2/2007 | Sridhar et al. | |
| 2007/0120625 A1 | 5/2007 | Larson, III et al. | |
| 2008/0061907 A1* | 3/2008 | Lee | H03H 3/02 333/188 |
| 2010/0134210 A1* | 6/2010 | Umeda | H03H 3/04 333/189 |
| 2010/0327701 A1* | 12/2010 | Grannen et al. | 310/346 |
| 2011/0121915 A1 | 5/2011 | Miller et al. | |
| 2011/0304412 A1* | 12/2011 | Zhang | 333/187 |
| 2012/0056694 A1* | 3/2012 | Pang | H03H 9/02149 333/187 |

FOREIGN PATENT DOCUMENTS

| | | |
|---|---|---|
| JP | 2006-319975 A | 11/2006 |
| JP | 2008-072156 | 3/2008 |
| JP | 2008-172711 | 7/2008 |
| KR | 10-2003-0034932 | 5/2003 |
| KR | 10-2004-0041029 | 5/2004 |
| KR | 10-0623396 | 9/2006 |
| KR | 10-2008-0034201 | 4/2008 |
| KR | 10-2009-0037828 | 4/2009 |
| KR | 10-2011-0058704 | 6/2011 |

OTHER PUBLICATIONS

US Data for solids, Acoustic impedance table Data, sound velocity values, Alan Selfridge Mar. 27, 2015.*

International Search Report dated Nov. 20, 2012 in International Application No. PCT/KR2012/004379 (3 pages, in English).

European Search Report dated Jul. 20, 2015 in counterpart European Patent Application No. 12866165.9 (6 pages, in English).

Chinese Office Action dated Mar. 16, 2016 in counterpart Chinese Patent Application No. 201280022984.2 (23 pages in Chinese with English translation).

Korean Office Action dated Dec. 18, 2017, in corresponding Korean Application No. 10-2012-0005760 (4 pages in English, 5 pages in Korean).

* cited by examiner

BULK ACOUSTIC WAVE RESONATOR

CROSS-REFERENCE TO RELATED APPLICATION(S)

This application claims the benefit under 35 USC § 119(a) of Korean Patent Application No. 10-2012-0005760, filed on Jan. 18, 2012, in the Korean Intellectual Property Office, the entire disclosure of which is incorporated herein by reference for all purposes.

BACKGROUND

1. Field

The following description relates to a bulk acoustic wave resonator (BAWR).

2. Description of Related Art

A bulk acoustic wave resonator (BAWR) may operate through electrodes that are disposed on and/or below a piezoelectric layer. In response to a high frequency signal being applied to the electrodes, the piezoelectric layer may oscillate. As a result, the BAWR may operate.

The BAWR may be used for wireless signal transfer, for example, as a wireless communication device, a wireless transmitter, a filter of a wireless sensor, a transmitter, a receiver, a duplexer, and the like. As another example, the BAWR may be used for input and output of wireless data.

There are various types of wireless communication devices for various purposes. The number of wireless devices conventionally regarded as wired devices, has rapidly increased. Accordingly, research on a radio frequency (RF) device that operates at a low power and a high speed is desired to consume less energy and to save resources.

SUMMARY

In one aspect, provided is a bulk acoustic wave resonator (BAWR), including a bulk acoustic wave resonant unit comprising a first electrode, a second electrode, and a piezoelectric layer disposed between the first electrode and the second electrode, and a reflective layer to reflect a resonant frequency that is generated from the piezoelectric layer due to a signal applied to the first electrode and the second electrode.

The BAWR may further comprise a substrate and an air cavity disposed above the substrate, wherein the reflective layer is disposed on the air cavity and below the bulk acoustic wave resonant unit.

The reflective layer may comprise a first reflective layer disposed below the bulk acoustic wave resonant unit, and a second reflective layer disposed below the first reflective layer and on the air cavity, and comprising a higher acoustic impedance than the first reflective layer.

The first reflective layer may comprise at least one of a silicon oxide-based material, a silicon nitride-based material, an aluminum oxide-based material, and an aluminum nitride-based material.

Each of the first reflective layer and the second reflective layer may comprise a thickness of approximately ¼ of a wavelength of the resonant frequency.

The reflective layer may comprise at least one of material having a temperature coefficient of frequency (TCF) that has a sign that is opposite to a sign of a TCF of the bulk acoustic wave resonant unit.

The reflective layer may comprise a material having a TCF, and a sum of the TCF of the material of the reflective layer and a TCF of the bulk acoustic wave resonant unit may be approximately zero.

The reflective layer may be disposed on the bulk acoustic wave resonant unit.

The reflective layer may comprise a first reflective layer disposed on the bulk acoustic wave resonant unit, and a second reflective layer disposed on the first reflective layer, and comprising higher acoustic impedance than the first reflective layer.

The first reflective layer may comprise at least one of a silicon oxide-based material, a silicon nitride-based material, an aluminum oxide-based material, and an aluminum nitride-based material.

The second reflective layer may comprise at least one of molybdenum (Mo), ruthenium (Ru), tungsten (W), and platinum (Pt) or a compound of at least two of Mo, Ru, W, and Pt.

The reflective layer may comprise a first reflective layer disposed below the bulk acoustic wave resonant unit, a second reflective layer disposed below the first reflective layer and on the air cavity, and comprising a higher acoustic impedance than the first reflective layer, a third reflective layer disposed on the bulk acoustic wave resonant unit, and a fourth reflective layer disposed on the third reflective layer, and comprising a higher acoustic impedance than the third reflective layer.

The first reflective layer and the third reflective layer may be formed of a material comprising a TCF that has a sign that is opposite to a sign of a TCF of the bulk acoustic wave resonant unit.

The first reflective layer and the third reflective layer may be formed of a material comprising a TCF, and a sum of the TCF of the material and a TCF of the bulk acoustic wave resonant unit may be approximately zero.

In another aspect, provided is a bulk acoustic wave resonator (BAWR), including a bulk acoustic wave resonant unit comprising a first electrode, a second electrode, and a piezoelectric layer disposed between the first electrode and the second electrode, a reflective layer to reflect a resonant frequency that is generated from the piezoelectric layer based on a signal applied to the first electrode and the second electrode, and a temperature coefficient of frequency (TCF) compensation layer to compensate for a TCF of the bulk acoustic wave resonant unit.

The BAWR may further comprise an air cavity disposed above a substrate, wherein the reflective layer is disposed on the air cavity and below the bulk acoustic wave resonant unit.

The TCF compensation layer may be disposed on or below the piezoelectric layer.

The TCF compensation layer may comprise a first TCF compensation layer disposed on the piezoelectric layer, and a second TCF compensation layer disposed below the bulk acoustic wave resonant unit.

The TCF compensation layer may comprise a material that has a TCF that has a sign that is opposite to a sign of the TCF of the bulk acoustic wave resonant unit.

The reflective layer may comprise a first reflective layer disposed below the bulk acoustic wave resonant unit, and a second reflective layer disposed below the first reflective layer and on the air cavity, and comprising a higher acoustic impedance than the first reflective layer.

Other features and aspects may be apparent from the following detailed description, the drawings, and the claims.

Figure 1:
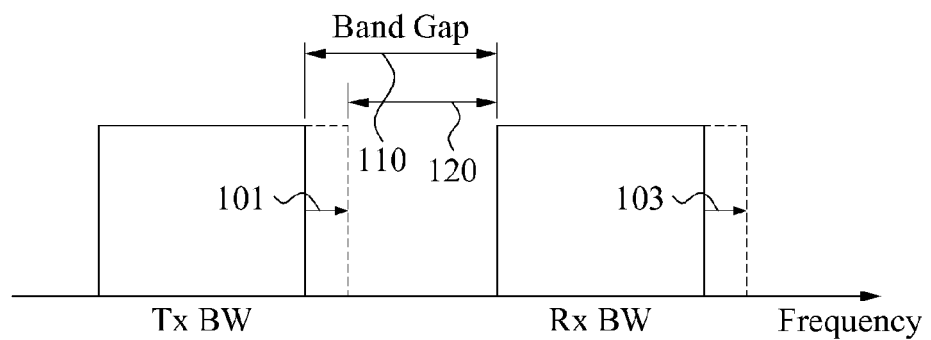
FIG. 1 is a diagram illustrating an example of a band gap between a transmission frequency and a reception frequency of a mobile communication terminal.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses and/or systems described herein. Accordingly, various changes, modifications, and equivalents of the methods, apparatuses, and/or systems described herein may be suggested to those of ordinary skill in the art. Also, descriptions of well-known functions and constructions may be omitted for increased clarity and conciseness.

A bulk acoustic wave resonator (BAWR) operates through electrodes that may be disposed on and/or below a piezoelectric layer. In response to a high frequency electric potential being applied to the electrodes, the piezoelectric layer may oscillate. As a result, the BAWR may function as a filter. For example, a BAWR may be disposed above a substrate with an air cavity in between so as to improve a reflection characteristic of an acoustic wave.

As an example, a BAWR may be used for input and output of wireless data, as a filter, a transmitter, a receiver, or a duplexer that is included in a wireless communication device such as a terminal. There are various types of wireless communication devices for various purposes, and the number of wireless devices conventionally regarded as wired devices, has rapidly increased. Thus, a number of fields to which the BAWR may be applied, has expanded.

The BAWR may be a device that induces oscillation or waves of a predetermined frequency using resonance. For example, the device may be used as a component in a radio frequency (RF) device such as a filter and an oscillator.

Due to a limited amount of frequency resources, companies that operate mobile communication systems, such as mobile phones, may pay a large cost for allocation of a frequency.

To prevent interference occurring between a transmitted signal and a received signal, a predetermined band gap may be used between the transmission frequency and the reception to frequency. In an effort to more effectively use frequency resources, there is a desire to reduce the band gap between the transmitted frequency and the received frequency.

For example, a resonator having a high Q value may be used to reduce the band gap in an RF communication system. To satisfy an increasing amount of transmitted data and transmission speed, a bandwidth may be increased.

The BAWR may be a device that causes resonance through use of a vertical acoustic wave and that electrically uses the resonance. The BAWR may use an air gap structure as a reflector, to reduce loss of an acoustic wave generated in a vertical direction, or may use a reflector structure in which a plurality of reflective layers are alternately evaluated.

Because an amount of transmitted and received data has increased, reducing a band gap between allocated frequency bands may be performed in order to secure a wider frequency band. To embody the idea, there is a desire for an apparatus that is capable of performing communication using a narrow band gap without interference occurring between a transmitted signal and a received signal.

FIG. 1 illustrates an example of a band gap between a transmission frequency and a reception frequency of a mobile communication terminal.

Referring to FIG. 1, a transmission frequency band may be increased by a width 101 and a reception frequency band may be increased by a width 103, in an effort to meet the demands of communication companies. As the transmission frequency band increases by the width 101, a band gap 110 decreases to a band gap 120.

A duplexer may be embodied using a BAWR that separates a transmitted signal and a received signal. In this example, in an effort to accurately and effectively separate the transmitted signal and the received signal within the narrowed band gap 120, a BAWR having a high quality factor (Q) value and a low temperature coefficient of frequency (TCF) may be used. The TCF of the BAWR signifies a ratio of a frequency variation of the BAWR within a range of a temperature at which the BAWR is used. In this example, as a value of the TCF becomes closer to zero, a frequency variance based on a temperature becomes lower.

Figure 2:
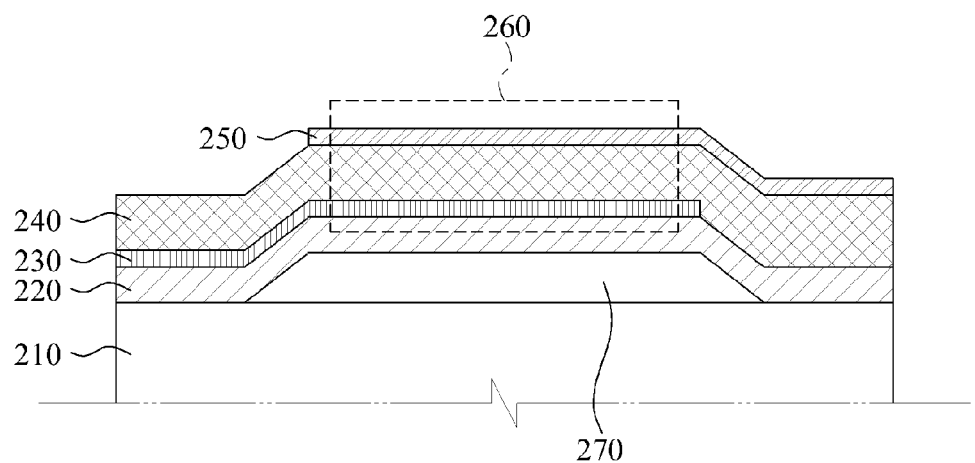
FIG. 2 is a diagram illustrating an example of a bulk acoustic wave resonator (BAWR).

FIG. 2 illustrates an example of a BAWR.

Referring to FIG. 2, the BAWR includes a substrate 210, a reflective layer 220, a bulk acoustic wave resonant unit 260, and an air cavity 270.

The substrate 210 may be a silicon or silicon on insulator (SOI) type. In this example, the bulk acoustic wave resonant unit 260 includes a first electrode 230, a piezoelectric layer 240, and a second electrode 250. The reflective layer 220 may reflect a wave of a resonant frequency generated from the piezoelectric layer 240, based on a signal applied to a first electrode 230 and a second electrode 250.

The reflective layer 220 may be a structure in which reflective layers have at least two characteristic. For example, the reflective layer 220 may include a first reflective layer and a second reflective layer having a relatively higher acoustic impedance than the first reflective layer.

Referring to FIG. 2, the first reflective layer is disposed below the first electrode 230, and the second reflective layer is disposed below the first reflective layer. In this example, if an acoustic wave generated in a direction from the second electrode 250 to the first electrode 230, that is, in a vertical direction downward, is directed to be incident upon the reflective layer 220, the acoustic wave may be reflected by an interface between two materials having different acoustic impedances. In this example, a magnitude of the reflected wave may be increased as a difference in acoustic impedances between the two materials increase.

For example, a phase of an acoustic wave that proceeds from a material having a high impedance to a material having a low impedance may be shifted by approximately 180 degrees, and thus, the acoustic wave may be reflected.

An acoustic impedance of the first reflective layer of the reflective layer 220 may be lower than an acoustic impedance of the second reflective layer, and the acoustic impedance of the second reflective layer may be lower than the air cavity 270. Accordingly, acoustic wave generated in a vertical direction from the bulk acoustic wave resonant unit 260 may be totally-reflected by an interface between the second reflective layer and the air cavity 270. For example, the reflected wave may have a phase difference of 180 degrees in comparison to an incident wave, and thus, the reflected wave may be offset by the incident wave so as to decrease a loss of energy. Accordingly, the loss of the vertical acoustic wave may be decreased.

The air cavity 270 may be formed, for example, by layering a sacrificial layer on the substrate 210, and patterning and etching the sacrificial layer.

A reflectance of the acoustic wave reflected by the first reflective layer and the second reflective layer may be calculated based on following equations.

$$Z_a = \rho \cdot v_a = \sqrt{\rho \cdot c}$$

$$v_a = \sqrt{\frac{c}{\rho}}$$

$$R = \frac{Z_2 - Z_1}{Z_2 + Z_1}$$

$$\lambda = \frac{v_a}{f}$$

$\rho$: density $c$: stiffness $v_a$: acoustic velocity $R$: reflection coefficient $Z_a$: acoustic impedance $\lambda$: wavelength $f$: frequency In these equations, $Z_1$ and $Z_2$ denote acoustic impedances of reflective layers, R denotes a reflective coefficient, $Z_a$ denotes an acoustic impedance of a material, $\rho$ denotes a density of a material, $v_a$ denotes an acoustic speed, $\lambda$ denotes a wavelength of a resonant frequency, f denotes a resonant frequency, and c denotes a stiffness.

Figure 3:
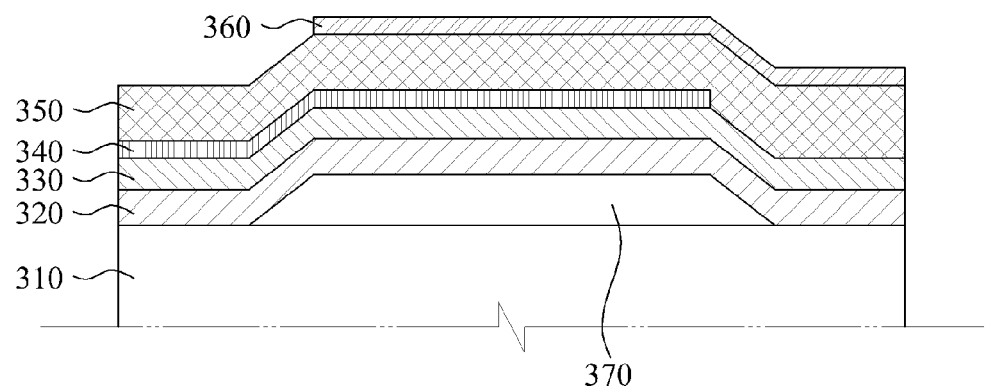
FIG. 3 is a diagram illustrating another example of a BAWR.

FIG. 3 illustrates another example of a BAWR.

Referring to FIG. 3, the BAWR includes a substrate 310, a reflective layer 320, a reflective layer 330, a first electrode 340, a piezoelectric layer 350, a second electrode 360, and an air cavity 370.

The air cavity 370 may be disposed on the substrate 310. That is, the air cavity in this example is disposed between the substrate 310 and the reflective layer 320. The reflective layer 320 is disposed on the air cavity 370. The reflective layer 330 is disposed on the reflective layer 320 and below the first electrode 340.

For example, the reflective layer 330 may have lower acoustic impedance than the reflective layer 320. The reflective layer 320 may have higher acoustic impedance than the reflective layer 330. Also, the reflective layer 320 may have lower acoustic impedance than the air cavity 370.

Through use of a structure in which the reflective layer 320 and the reflective layer 330 are coupled, an acoustic wave generated in a direction from the second electrode 360 to the first electrode may not be lost in the air cavity 370 due to a difference in acoustic impedances, and may be totally-reflected or almost totally-reflected so as to be maintained in the piezoelectric layer 350.

A resonant frequency may be generated from the piezoelectric layer 350 based on a voltage applied to the first electrode 340 and the second electrode 360. In this example, the reflective layer 320 and the reflective layer 330 may be formed to have a thickness of approximately ¼ of a wavelength of a resonant frequency that is generated from the piezoelectric layer 350. That is, each of the reflective layer 320 and the reflective layer 330 may be formed to have a thickness approximating to ¼ of the wavelength of the resonant frequency.

The bulk acoustic wave resonant unit may include the first electrode 340, the piezoelectric layer 350, and the second electrode 360. The reflective layer 330 may include at least one material that has a temperature coefficient of frequency (TCF) that has a sign that is opposite to a sign of a TCF of the bulk acoustic wave resonant unit. For example, if the bulk acoustic wave resonant unit has a minus TCF value, the reflective layer 330 may be formed of a material having a plus TCF value.

The reflective layer 330 may be formed of a material that has a TCF. A sum of the TCF of the material of the reflective layer 330 and the TCF of the bulk acoustic wave resonant unit may be approximately zero.

For example, the reflective layer 330 may be formed of one or more of a silicon oxide-based material, a silicon nitride-based material, an aluminum oxide-based material, and an aluminum nitride (AlN)-based material. As another example, the reflective layer 330 may be formed of one or more of silicon dioxide ($SiO_2$), trisilicon tetranitride ($Si_3N_4$), zinc oxide (ZnO), MN, aluminum (Al), gold (Au), and aluminum oxide ($Al_2O_3$).

The reflective layer 320 may be formed of a material including at least one of molybdenum (Mo), ruthenium (Ru), tungsten (W), and platinum (Pt), or a compound of at least two of Mo, Ru, W, and Pt.

Figure 4:
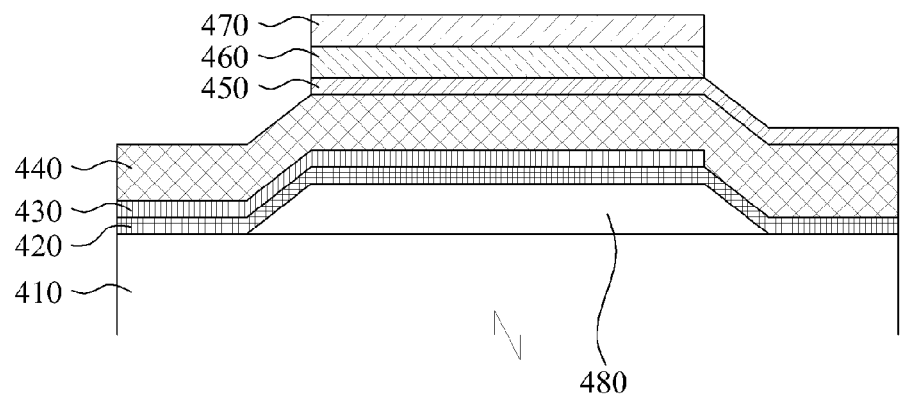
FIG. 4 is a diagram illustrating another example of a BAWR.

FIG. 4 illustrates another example of a BAWR.

Referring to FIG. 4, the BAWR includes a substrate 410, a membrane 420, a first electrode 430, a piezoelectric layer 440, a second electrode 450, a reflective layer 460, a reflective layer 470, and an air cavity 480.

The air cavity 480 is disposed on the substrate 410. To maintain a shape of the air cavity 480, in this example the membrane 420 is disposed on the air cavity 480.

The first electrode 430 may be disposed on the membrane 420. The reflective layer 460 is disposed on the second electrode 450 and the reflective layer 470 is disposed on the reflective layer 460.

The reflective layer 460 may have relatively lower acoustic impedance than the reflective layer 470. That is, the reflective layer 470 may have relatively higher acoustic impedance than the reflective layer 460. The reflective layer 470 may have relatively lower acoustic impedance than air.

Through use of a structure in which the reflective layer 460 and the reflective layer 470 are coupled, an acoustic wave generated from the first electrode 430 to the second electrode 450 may not be lost due to a difference in acoustic impedances, and may be reflected so as to be maintained in the piezoelectric layer 440.

A resonant frequency may be generated from the piezoelectric layer 440 based on a voltage applied to the first electrode 430 and the second electrode 450. For example, the reflective layer 460 and the reflective layer 470 may each be formed to have a thickness of approximately ¼ of a wavelength of a resonant frequency that is generated from the piezoelectric layer 440. That is, each of the reflective layer 460 and the reflective layer 470 may be formed to have a thickness approximating to ¼ of the wavelength of the resonant frequency.

The bulk acoustic wave resonant unit may include the first electrode 430, the piezoelectric layer 440, and the second electrode 450. The reflective layer 460 may be formed of a material that has a TCF that has a sign that is opposite to a sign of a TCF of the bulk acoustic wave resonator. For example, if the bulk acoustic wave resonant unit has a minus TCF value, the reflective layer 460 may be formed of a material having a plus TCF value.

The reflective layer 460 may be formed of a material that has a TCF. A sum of the TCF of the material of the reflective layer 460 and the TCF of the bulk acoustic wave resonant unit may be approximately zero.

For example, reflective layer 460 may be formed of one or more of a silicon oxide-based material, a silicon nitride-based material, an aluminum oxide-based material, and an aluminum nitride-based material, for example, $SiO_2$, $Si_3N_4$, ZnO, MN, Al, Au, and $Al_2O_3$.

For example, the reflective layer 470 may be formed of a material including at least one of Mo, Ru, W, and Pt, or a compound of at least two of Mo, Ru, W, and Pt.

Figure 5:
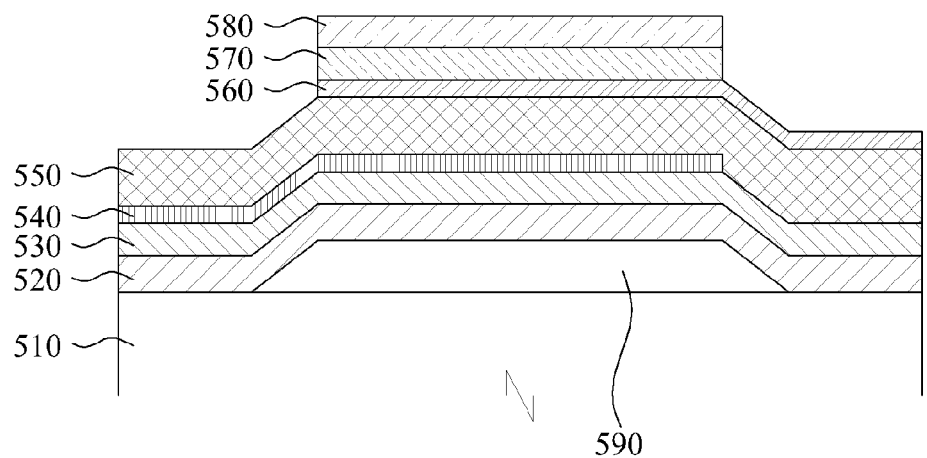
FIG. 5 is a diagram illustrating another example of a BAWR.

FIG. 5 illustrates another example of a BAWR

Referring to FIG. 5, the BAWR may include reflective layers disposed on and/or below a bulk acoustic wave resonant unit.

In this example, an air cavity 590 is disposed on a substrate 510. A reflective layer 520 may be disposed on a portion of the substrate 510 and on the air cavity 590. The reflective layer 530 may be disposed on the reflective layer 520, and below the first electrode 540.

For example, the reflective layer 530 may have relatively lower acoustic impedance than the reflective layer 520. That is, the reflective layer 520 may have relatively higher acoustic impedance than the reflective layer 530. Also, the reflective layer 520 may have lower acoustic impedance than the air cavity 570.

Through use of a structure in which the reflective layer 520 and the reflective layer 530 are coupled, an acoustic wave generated in a direction from the second electrode 560 to the first electrode 540 may not be lost in the air cavity 590 due to a difference in acoustic impedances, and may be totally-reflected so as to be maintained in the piezoelectric layer 550.

In this example, the reflective layer 570 is disposed on the second electrode 560 and below the reflective layer 580. The reflective layer 580 is disposed on the reflective layer 570.

For example, the reflective layer 570 may have relatively lower acoustic impedance than the reflective layer 580. The reflective layer 580 may have relatively higher acoustic impedance than the reflective layer 570. Also, the reflective layer 580 may have lower acoustic impedance than air.

For example, through the use of a structure in which the reflective layer 570 and the reflective layer 580 are coupled, an acoustic wave generated in a direction from the first electrode 540 to the second electrode 560 may not be lost in an air due to a difference in acoustic impedances, and may be totally reflected so as to be maintained in the piezoelectric layer 550.

A resonant frequency may be generated from the piezoelectric layer 550 based on a voltage applied to the first electrode 540 and the second electrode 560. As an example, each of the reflective layer 520, the reflective layer 530, the reflective layer 570, and the reflective layer 580 may be formed to have a thickness of approximately ¼ of a wavelength of a resonant frequency that is generated from the piezoelectric layer 550.

The bulk acoustic wave resonant unit may include the first electrode 540, the piezoelectric layer 550, and the second electrode 560. For example, the reflective layer 530 and the reflective layer 570 may be formed of a material that has a TCF that has a sign that is opposite to a sign of a TCF of the bulk acoustic wave resonant unit. For example, if the bulk acoustic wave resonant unit has a minus TCF value, the reflective layer 530 and the reflective layer 570 may be formed of a material that has a plus TCF value.

The reflective layer 530 and the reflective layer 570 may be formed of a material having a TCF. A sum of the TCF of the material and the TCF of the bulk acoustic wave resonant unit may be approximately zero.

For example, the reflective layer 530 and the reflective layer 570 may be formed of one or more of a silicon oxide-based material, a silicon nitride-based material, an aluminum oxide-based material, and an aluminum nitride-based material, for example, $SiO_2$, $Si_3N_4$, ZnO, AlN, Al, Au, and $Al_2O_3$.

For example, the reflective layer 520 and the reflective layer 580 may be formed of a material including at least one of Mo, Ru, W, and Pt, or a compound of at least two of Mo, Ru, W, and Pt.

Figure 6:
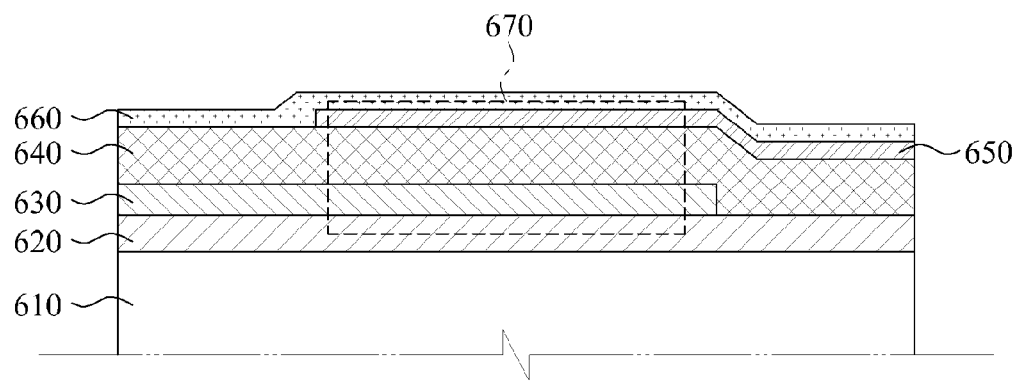
FIG. 6 is a diagram illustrating another example of a BAWR.

FIG. 6 illustrates another example of a BAWR.

Referring to FIG. 6, the BAWR includes a substrate 610, a reflective layer 620, a bulk acoustic wave resonant unit 670, and a TCF compensation layer 660.

For example, the substrate 610 may be a silicon or SOI type. The bulk acoustic wave resonant unit 670 may include a first electrode 630, a piezoelectric layer 640, and a second electrode 650. A resonant frequency may be generated from the piezoelectric layer 640 based on a signal applied to the first electrode 630 and the second electrode 650. In this example, the reflective layer 620 may reflect a wave of a resonant frequency that is generated from the piezoelectric layer 640.

The reflective layer 620 may include reflective layers that have at least two characteristics. For example, the reflective layer 620 may have a first reflective layer having a relatively low acoustic impedance and a second reflective layer having a relatively high acoustic impedance in comparison to the first reflective layer.

Referring to FIG. 6, the first reflective layer is disposed below the first electrode 630, and the second reflective is disposed below the first reflective layer.

If an acoustic wave generated in a direction from the second electrode 650 to the first electrode 630, that is, a vertical direction, is directed to be incident upon the reflective layer 620, the acoustic wave may be reflected by an interface between two material that have the different acoustic wave impedances. In this example, a magnitude of the reflected wave may be increased as a difference in acoustic impedances between the two materials increases.

The TCF compensation layer 660 may compensate for a TCF of the bulk acoustic wave resonant unit 670. For example, the TCF compensation layer 660 may be formed of a material that has a TCF that has a sign that is opposite to a sign of the TCF of the bulk acoustic wave resonant unit 670. A TCF of the BAWR may approximate to zero by adding the TCF of the bulk acoustic wave resonant unit 670 and the TCF of the TCF compensation layer 660.

For example, the TCF compensation layer 660 may be formed by doping an impurity element to silicon oxide or silicon nitride. By doping the impurity element, the TCF of the TCF compensation layer 660 may be more finely adjusted. Examples of impurity elements include arsenic (As), antimony (Sb), phosphorus (P), barium (B), germanium (Ge), silicon (Si), and Aluminum (Al), or a compound of at least two of As, Sb, P, B, Ge, Si, and Al.

A loss of a vertical acoustic wave decreases through use of the reflective layer 620 and thus, a quality factor (Q) value of the BAWR may be improved. For example, the TCF value of the BAWR may become close to zero through use of the TCF compensation layer 660, and thus, the BAWR may accurately separate a transmitted signal and a received signal from a narrow band gap.

Figure 7:
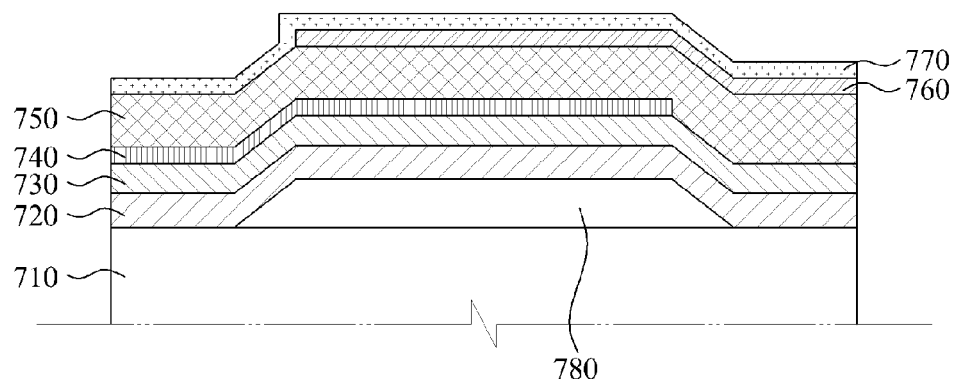
FIG. 7 is a diagram illustrating another example of a BAWR.

FIG. 7 illustrates another example of a BAWR.

Referring to FIG. 7, the BAWR includes a substrate 710, a reflective layer 720, a reflective layer 730, a first electrode 740, a piezoelectric layer 750, a second electrode 760, a TCF compensation layer 770, and an air cavity 780.

The air cavity 780 is disposed on the substrate 710. The reflective layer 720 is disposed on the air cavity 780 and on a portion of the substrate 710. The reflective layer 730 is disposed on the reflective layer 720 and below the first electrode 740.

For example, the reflective layer 730 may have relatively lower acoustic impedance than the reflective layer 720. That is, the reflective layer 720 may have relatively higher acoustic impedance than the reflective layer 730. Also, the reflective layer 720 may have relatively lower acoustic impedance than the air cavity 770.

For example, through the use of a structure in which the reflective layer 720 and the reflective layer 730 are coupled, an acoustic wave generated in a direction from the second electrode 760 to the first electrode 740 may not be lost in the air cavity 770 due to a difference in acoustic impedances, and may be totally reflected so as to be maintained in the piezoelectric layer 750.

The TCF compensation layer 770 may be formed, for example, by doping an impurity element on silicon oxide or silicon nitride. By doping the impurity element, the TCF of the TCF compensation layer 660 may be finely adjusted. Examples of the impurity elements include at least one of As, Sb, P, B, Ge, Si, and Al, or a compound of at least two of As, Sb, P, B, Ge, Si, and Al.

Figure 8:
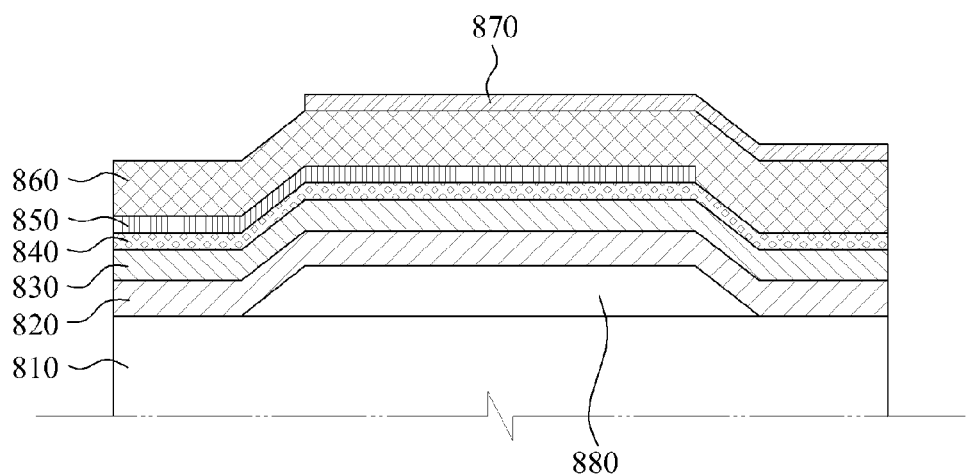
FIG. 8 is a diagram illustrating another example of a BAWR.

FIG. 8 illustrates another example of a BAWR.

Referring to FIG. 8, the BAWR includes a substrate 810, a reflective layer 820, a reflective layer 830, a TCF compensation layer 840, a first electrode 850, a piezoelectric layer 860, a second electrode 870, and an air cavity 880. The BAWR may include the first electrode 850, the piezoelectric layer 860, and the second electrode 870.

In this example, the TCF compensation layer 840 is disposed below a bulk acoustic wave resonant unit. The TCF compensation layer 840 is disposed below the first electrode 850.

Figure 9:
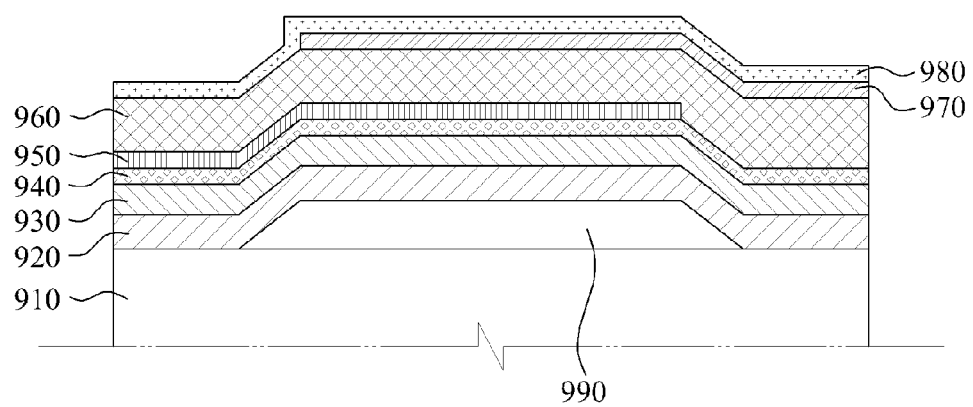
FIG. 9 is a diagram illustrating another example of a BAWR.

FIG. 9 illustrates another example of a BAWR.

Referring to FIG. 9, the BAWR includes a substrate 910, a reflective layer 920, a reflective layer 930, a TCF compensation layer 940, a first electrode 950, a piezoelectric layer 960, a second electrode 970, a TCF compensation layer 980, and an air cavity 990.

In this example, the TCF compensation layer 940 is disposed below the first electrode 950, and the TCF compensation layer 980 is disposed on the second electrode 970.

As a non-exhaustive illustration only, a terminal/device/unit described herein may refer to mobile devices such as a cellular phone, a personal digital assistant (PDA), a digital camera, a portable game console, and an MP3 player, a portable/personal multimedia player (PMP), a handheld e-book, a portable laptop PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

A computing system or a computer may include a microprocessor that is electrically connected with a bus, a user interface, and a memory controller. It may further include a flash memory device. The flash memory device may store N-bit data via the memory controller. The N-bit data is processed or will be processed by the microprocessor and N may be 1 or an integer greater than 1. Where the computing system or computer is a mobile apparatus, a battery may be additionally provided to supply operation voltage of the computing system or computer. It will be apparent to those of ordinary skill in the art that the computing system or computer may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

A number of exampled have been described herein. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A bulk acoustic wave resonater (BAWR), comprising:
a substrate;
an air cavity disposed below a first electrode;
a bulk acoustic wave resonant unit, disposed above the air cavity, and comprising;
a piezoelectric layer,
the first electrode disposed above the piezoelectric layer, and
a second electrode disposed above the piezoelectric layer;
a first reflective layer disposed between a second reflective layer and the second electrode; and
the second reflective layer disposed between the first reflective layer and the air cavity,
wherein the second reflective layer has a different acoustic impedance than the first reflective layer,
wherein the first reflective layer comprises at least one material to compensate for a temperature coefficient of frequency (TCF) of the bulk acoustic wave resonant unit, such that the first reflective layer comprises:
a material configured in the reflective layer to have a set lower impedance characteristic; and
a material configured to provide a set TCF compensation characteristic set to compensate for a TCF of the bulk acoustic wave resonator toward approximately zero.

2. The BAWR of claim 1, wherein the material configured in the reflective layer to have a set lower impedance characteristic has a thickness of approximately one fourth (¼) of a wavelength of a resonant frequency of the BAWR and a reflective material, with the different acoustic impedance, of the second reflective layer has the thickness of approximately one fourth (¼) of the wavelength.

3. The BAWR of claim 1, wherein, due to the material configured to provide the set TCF compensation characteristic, the first reflective layer has a TCF that has a plus or minus sign that is opposite to a plus or minus sign of the TCF of the bulk acoustic wave resonant unit.

4. The BAWR of claim 1, wherein the material configured in the reflective layer to have the set lower impedance characteristic comprises at least one of: a silicon oxide-based material, a silicon nitride-based material, an aluminum oxide-based material, and an aluminum nitride-based material.

5. The BAWR of claim 1, wherein the material configured to provide a set TCF compensation characteristic is a dopant added to the material configured in the reflective layer to have a set lower impedance characteristics.

6. The BAWR of claim 1, wherein the second reflective layer comprises at least one of: molybdenum (Mo), ruthenium (Ru), tungsten (W), and platinum (Pt) or a compound of at least two of Mo, Ru, W, and Pt.

7. The BAWR of claim 1, wherein the material configured to provide a set TCF compensation characteristic compensates for a TCF sum of at least the bulk acoustic wave resonant unit and the second reflective layer to approximately zero.

* * * * *